United States Patent
Shacham-Diamand et al.

[19]

[11] Patent Number: 5,830,805
[45] Date of Patent: Nov. 3, 1998

[54] ELECTROLESS DEPOSITION EQUIPMENT OR APPARATUS AND METHOD OF PERFORMING ELECTROLESS DEPOSITION

[75] Inventors: Yosi Shacham-Diamand, Ithaca, N.Y.; Valery M. Dubin, Cupertino, Calif.; Chiu H. Ting, Saratoga, Calif.; Bin Zhao, Irvine, Calif.; Prahalad K. Vasudev, Austin, Tex.

[73] Assignees: Cornell Research Foundation, Ithaca, N.Y.; Sematech, Inc., Austin, Tex.; Intel Corporation, Santa Clara, Calif.

[21] Appl. No.: 751,631

[22] Filed: Nov. 18, 1996

[51] Int. Cl.[6] ................................................ H01L 21/44
[52] U.S. Cl. ........................ 438/678; 438/908; 438/913
[58] Field of Search ............................. 437/230; 438/908, 438/913, 678

[56] References Cited

U.S. PATENT DOCUMENTS

| | | | |
|---|---|---|---|
| 3,801,368 | 4/1974 | Fusayama et al. | 117/239 |
| 4,894,260 | 1/1990 | Kumasaka et al. | 427/241 |
| 5,071,518 | 12/1991 | Pan | 205/122 |
| 5,075,259 | 12/1991 | Moran | 437/230 |
| 5,171,709 | 12/1992 | Donelon et al. | 437/173 |
| 5,308,796 | 5/1994 | Feldman et al. | 437/200 |
| 5,424,252 | 6/1995 | Morishita | 437/230 |

*Primary Examiner*—Charles L. Bowers
*Assistant Examiner*—Reneé R. Berry

[57] ABSTRACT

An electroless deposition apparatus and a method of electroless deposition that uses a single process chamber for performing multiple processes by moving through the process chamber a variety of fluids one at a time in a sequential order.

15 Claims, 8 Drawing Sheets

ELECTROLESS DEPOSITION EQUIPMENT OR APPARATUS AND METHOD OF PERFORMING ELECTROLESS DEPOSITION

BACKGROUND OF THE INVENTION

1. Field of the Invention

The present invention relates to semiconductor manufacturing equipment.

2. Description of the Related Art

A common apparatus found in semiconductor manufacturing is a chemical bath station, which usually consists of one or more baths where a bath is a container type vessel containing a processing fluid. Most semiconductor manufacturing processes such as depositing, etching, rinsing, and/or cleaning can use bathes in each respective process. In a multiple bath station (or a process requiring multiple bathes), each bath will generally correspond to a single step in the manufacturing process and will require transporting or moving the wafer in a sequential order from bath to bath (step to step) in order to complete the process. At each bath, the semiconductor wafer is placed within the bath so that the processing fluid can chemically interact with some or all of the wafer. The types of processing fluids contained within a bath will vary according to the specific process and may include fluids such as electrolytic solutions, reducing agents, complexing agents, pH adjusters, de-ionized (DI) water, or $N_2$.

There are three basic types of baths: a full immersion bath, a spray immersion bath, or a combination of the two. A fully immersion bath completely immerses a semiconductor wafer in a processing fluid when the wafer is within the bath. The spray immersion bath, on the other hand, uses some type of dispersing apparatus, a spray bar for example, to disperse the processing fluid over the wafer when the wafer is within the bath. A combination bath uses a dispersing apparatus to disperse the processing fluid onto the wafer while filling the bath until the wafer is fully immersed by the fluid.

One type of semiconductor manufacturing process that uses a bath is the electroless deposition of metal process that involves the formation of a thin film of material from an electrolytic solution or fluid without applying an external voltage to the fluid. The depositing of metal results from the electrochemical reaction between the metal ions of the electrolytic solution, reducing agents, complexing agents, and pH adjusters on a catalytic surface (such as may be found on a semiconductor wafer). Electroless deposition is quite suitable for forming barriers and interconnects between the different layers of on a wafer.

A common problem in using bathes, which is especially true for the electroless deposition process, is that foreign particles or contaminants will be deposited on the substrate surface of the wafer when transferring the wafers from one bath to another bath. Another common problem is the exposure of the substrate surface of the wafer to air during the transfer (from bath to bath) can cause the non-wetting of deep and narrow trenches in the surface or small via (contact) holes in the surface because of electrolyte evaporation. And yet another common problem is that exposure to air may cause oxidation of the catalytic surface that will result in poor catalytic activity and poor quality metal deposits. This problem becomes especially troublesome when using materials that easily oxidize in air such as copper. To produce high quality metal deposits in the submicron range, therefore, it is more desirable not to transfer the wafer between the process chambers and to avoid exposing the wafer to air by using a single bath or process chamber and moving the different fluids for each step in the process through the process chamber.

SUMMARY OF THE INVENTION

The present invention discloses an electroless deposition apparatus and method of performing electroless deposition for processing a semiconductor wafer that uses a sealed process chamber to subject the wafer to more than one processing fluid while retaining the wafer within the chamber. The present invention is useful for manufacturing processes that include depositing, etching, cleaning, rinsing, and/or drying. The process chamber used in the preferred embodiment comprises a sealed container capable of holding one or more semiconductor wafers. A distribution system introduces a first fluid into the chamber for processing the wafer and then removes the first fluid from the chamber after processing the wafer. The distribution system then introduces the next fluid into the chamber for processing the wafer and then removes the next fluid from the chamber after processing the wafer. This procedure continues until the manufacturing process finishes. The fluids used in the present invention depends on the process performed and may include fluids such as DI water, $N_2$ for flushing, and electrolytic solutions comprising reducing agents, complexing agents, or pH adjusters.

The fluid enters the sealed process chamber through an inlet, and exits the chamber through an outlet. As the fluid enters the process chamber, the fluid is dispersed across the wafer in a uniform flow. A recirculation system moves the fluid through the process chamber using a temperature control system, chemical concentration monitoring system, pump system, and a filtration system before re-circulating the fluid back through the process chamber.

The present invention additionally discloses a sealed process chamber for processing a semiconductor wafer that subjects the wafer to more than one processing fluid while retaining the wafer in the chamber. The sealed process chamber comprises a sealed container with an inlet and an outlet that allow more than one fluid to flow through the container across a semiconductor wafer and process the wafer. Additional embodiments include: a rotatably mounted tubular wafer housing with a wafer mounted on either or both sides of the housing surface; an inner core mounted inside of the tubular housing when mounting a wafer on the inside surface of the housing; and a dispersal apparatus for dispersing the fluid in a uniform flow over the wafer.

DETAILED DESCRIPTION OF THE INVENTION

Figure 1:
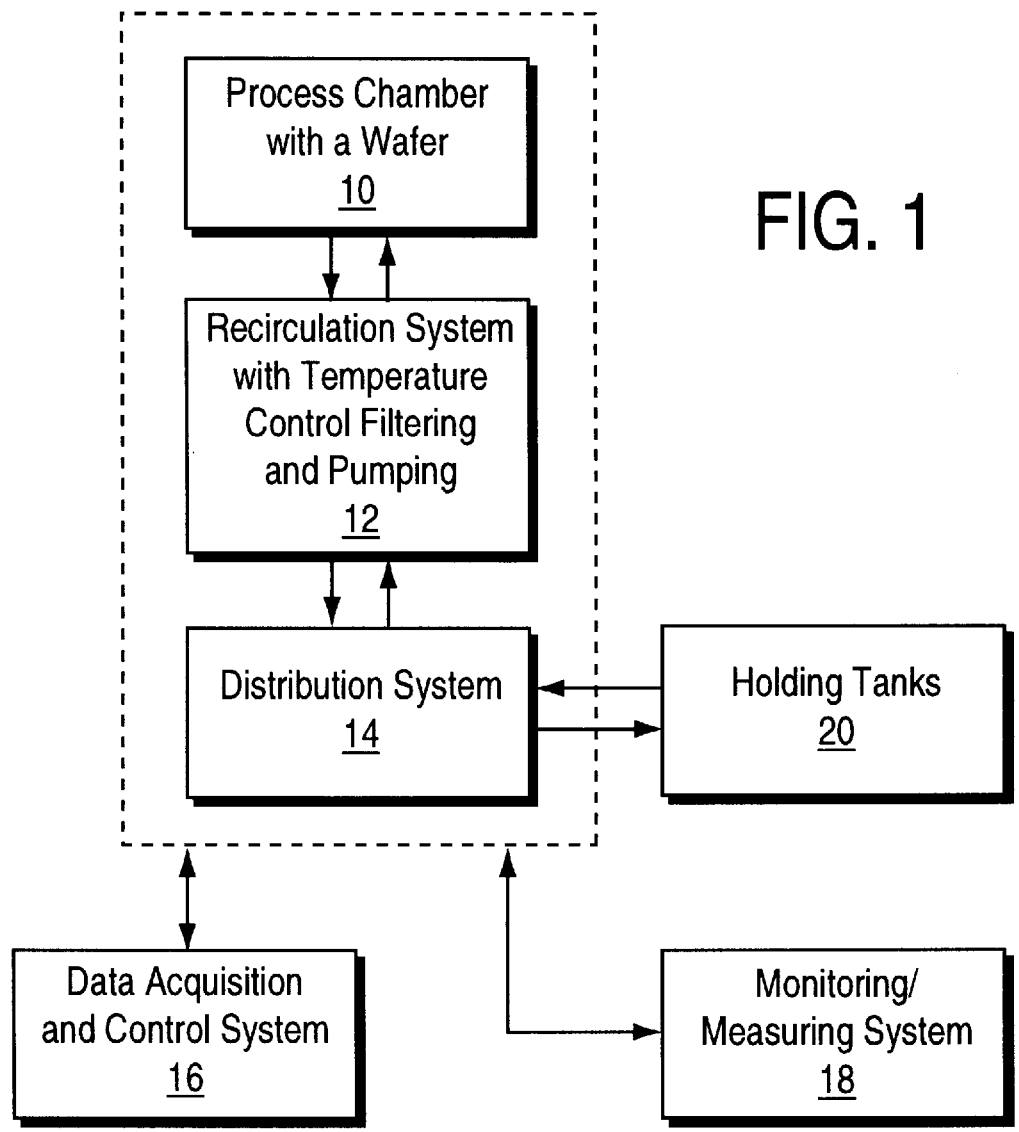
FIG. 1 is a system diagram of the present invention.

This present invention discloses an electroless deposition apparatus and a method of electroless deposition that uses a single sealed process chamber for performing multiple processes by moving multiple fluids sequentially through the process chamber. This disclosure describes numerous specific details that include specific materials, structures, chemicals, and processes in order to provide a thorough understanding of the present invention. One skilled in the art, however, will appreciate that one may practice the present invention without these specific details. In other instances, this disclosure does not describe well known processes and structures in detail in order not to obscure the present invention.

This disclosure describes the preferred embodiment in reference to the electroless deposition of copper (Cu) structures. There are other processes that use a bath including metallizing, depositing, etching, cleaning, rinsing, and/or drying and the use of other materials including metals, alloys, and conductive materials. One skilled in the art will appreciate that the fabrication of a multiple-metal layer structure atop a substrate, such as a silicon substrate, to manufacture a semiconductor device is well known in the art. Generally then, a semiconductor device will utilize dielectric materials such as silicon dioxide ($SiO_2$) to separate the conductive regions in a semiconductor wafer. Contact openings are formed in the dielectric overlying the substrate region to provide conductive pathways to the source, drain, and gate regions from a first metal layer. Via openings then are formed in the subsequent inter-level dielectric (ILD) layers separating the various metal layers to provide conductive pathways between the metal layers.

Now being investigated for use as a material for filling an interconnect (plugs and vias) between layers is copper. Although copper has improved electrical properties over other metals, manufacturing interconnects with copper incurs an additional and substantial cost and time not seen in other metals due to physical properties that include its ability to diffuse and or drift easily in inter-level-dielectric (ILD) materials such as $SiO_2$ based ILD materials (requiring encapsulating the copper interconnect), and its readiness to oxidize in the presence of air (preferably requiring a vacuum and or an $N_2$ atmosphere during the deposition process). The preferred embodiment of the present invention is for depositing Cu for interconnects. An example of the use of multiple fluids for electrolessly depositing copper is found in patent application Ser. No. 08/587,262, filed Jan. 16, 1996, titled "Electroless Cu Deposition On a Barrier Layer by Cu Contact Displacement for ULSI Applications;", and incorporated into this application by reference. The present invention is applicable, as others skilled in the art will appreciate after reading this disclosure, to any process for depositing, etching, cleaning, rinsing, and or drying.

FIG. 1 is a system diagram for the practice of the present invention. A single process chamber 10 contains a semiconductor wafer. More than one processing fluid stored in more than one holding tank 20 flow through process chamber 10 and over the wafer. A distribution system 14 introduces the fluids to and removes the fluids from a recirculation system 12. The recirculation system 12 circulates the fluids through process chamber 10 to a temperature control system, a filtration system, and a pump system before re-circulating the fluids back through process chamber 10. Other components used by the present invention include data acquisition and control system 16, and monitoring and measuring system 18.

Figure 2:
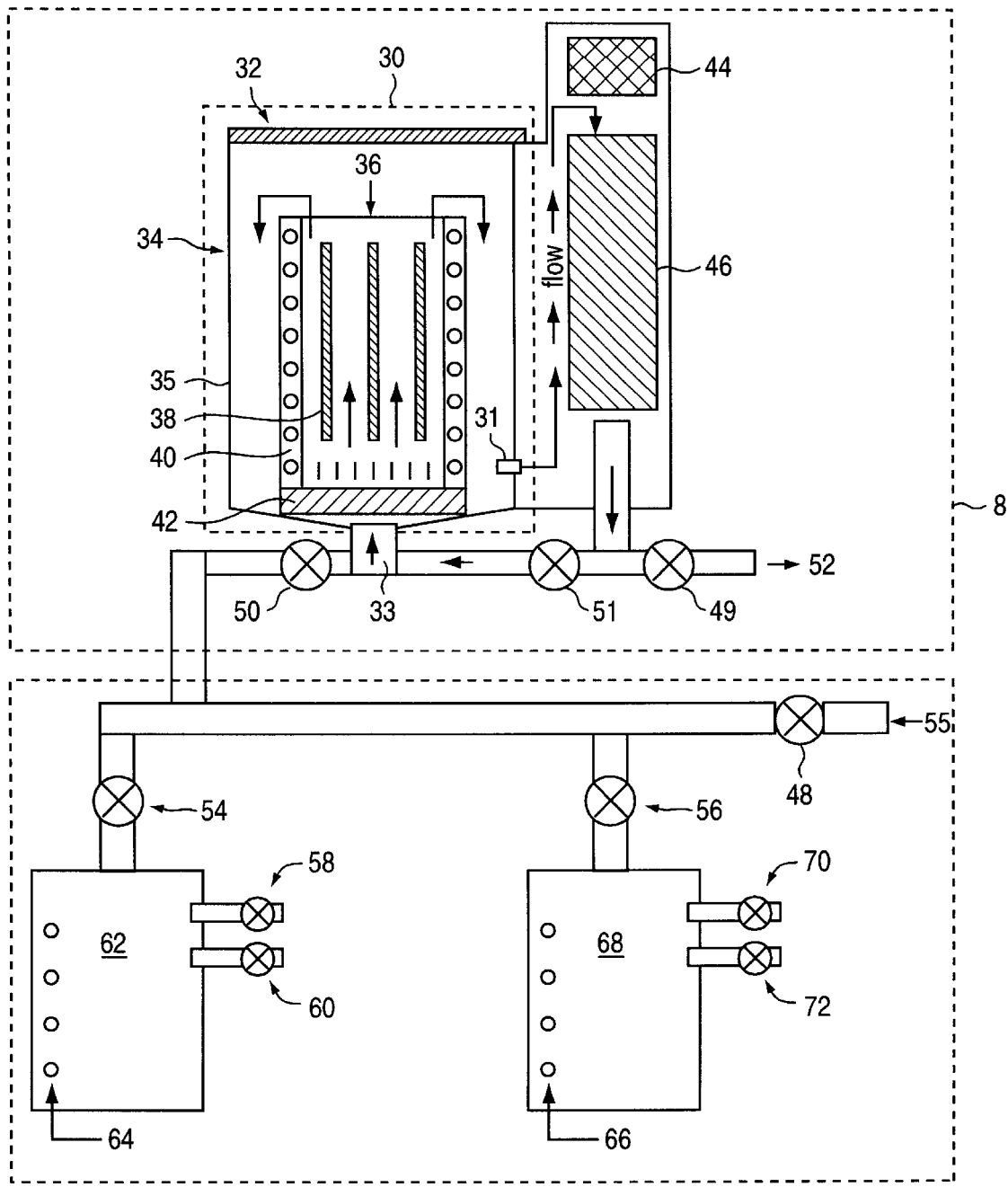
FIG. 2 is a schematic diagram of a full immersion embodiment of the present invention for processing multiple wafers.

FIG. 2 is a schematic diagram of one embodiment for a full immersion bath apparatus 8 used for processing one or more semiconductor wafers. A sealed process chamber 30 comprises an outer container 35, an inner process chamber 36, and cover 30. The sealed process chamber 30 allows the processing of the wafers 38 to proceed in the absence of air (in a vacuum or in the presence of another gas such as $N_2$) to reduce or prevent particle contamination of the wafer or oxidation of a layer on the surface of the wafer as will occur when exposing the wafer to air in an electrolytic process. Although this embodiment can process a single wafer, inner process chamber 36 is shown having multiple semiconductor wafer housings or holders for holding multiple semiconductor wafers 38. A processing fluid enters inner process chamber 36 through an inlet 33. This embodiment shows one inlet 33 although other embodiments may include multiple inlets. The fluid flows through a dispersion bar 42 to control the flow dynamics of the fluid so that the fluid flows over the wafers 38 in a uniform flow. The fluid exits inner process chamber 36 by flowing into overflow weir 34. The fluid exits the process chamber 30 through an outlet 31. This embodiment shows an outlet 31 although other embodiments of the present invention may include multiple outlets. A status panel 44 contains information from a data acquisition and control system and a monitoring and measuring system. A recirculation system circulates the fluid from process chamber 30 through the combination pump and filter system 46, before re-circulating the fluid back through process chamber 30 and repeats this circulation until the completion of the process step. The temperature coil 40 is used to maintain the fluid inside the chamber at a fixed temperature. It is understood, although not shown in FIG. 2, that such temperature control utility can be installed along with the liquid circulation systems such as pump and filter system 46 and the holding tanks 62 and 68. Although this embodiment shows the components of the recirculation system in a particular order, other placements of the recirculation system components are possible.

A distribution system comprises the necessary pipes and holding facilities to allow more than one fluid to enter into the process chamber and the recirculation system in a sequential and specified order. Although this embodiment shows a distribution system comprising the holding tanks 62 and 68, other embodiments may include more than two holding tanks. Holding tank 62 contains a first fluid and holding tank 68 contains the second or next fluid. The distribution valves 54 and 56 control when the first fluid and the next fluid enter to and exit from process chamber 30 and the recirculation system. The vacuums 58 and 70 and the Nitrogen 60 and 72 provide the physical locomotion to move the fluids from the holding tanks 62 and 68 to and from the process chamber 30 to begin a process step. And, the temperature coils 64 and 66 provides temperature control for the fluids stored in the holding tanks. Although this embodiment shows a vacuum and nitrogen used as the locomotive force for the fluids, other embodiments may comprise different locomotives means. The flow valves 48, 49, 50, and 51 control the flow of the fluid through this embodiment.

During a process step, flow valves 49 and 50 are closed with valve 51 open to allow a processing fluid to circulate from process chamber 30 with temperature control system 40, and pump and filter system 46, before re-circulating back through process chamber 30. After the process step, the flow valves open and or close to allow the used fluid to flow out to the waste system 52 or back into a holding tank 62 or 68. If rinsing the wafers with de-ionized (Dl) water, flow valve 48 allows the Dl water to flow into process chamber 30 from the distribution system.

This disclosure describes the preferred embodiment in reference to the electroless deposition of copper (Cu) structures. Although the preferred embodiment describes the use of Cu, other metals such as Ni, Co, Fe, Au, Ag, Pd, Pt, Rh, Al, Ta, TiN, AlCu, AlSiCu, Ti, W, TiW, TaN and WN, as well as non-metals such as dielectrics or semiconductor can be readily deposited, etched, cleaned, or dried using the present invention. Manufacturing Cu structures presents several problems because Cu readily oxidizes in air.

To prevent the oxidation in air of the Cu, the standard practice is to limit the exposure of the wafer to air. The sealed process chamber of the present invention overcomes this problem because the wafer remains in the same process chamber for the different processes (i.e. the wafer is not moved between multiple bathes) and the processing can proceed in the absence of air (a vacuum) or replacing the air with an inert gas such as $N_2$. An additional benefit of the present invention is the reduction of contaminants because that the wafer is no longer moved between chambers.

To prevent the diffusion of the Cu in a dielectric material, the standard practice is to encapsulate Cu with another barrier metal such as Ta or TiN. The first part of the encapsulation process is to lay a barrier layer of another metal, TiN for example, over the wafer (or specific structures on the wafer) before depositing the Cu. To deposit Cu over most materials, however, requires the surface of the underlying material to be made susceptible for autocatalytic growth of Cu. The method of contact displacement (in liquid) is one such technique for treating the surface of the underlying material. The present invention improves upon the current practice because the use of a single chamber for multiple fluids (i.e., process steps) reduces the overall process time when compared to using multiple bathes.

Referring to FIG. 2, holding tank 62 would for example contain a first fluid to make the underlying TiN susceptible to autocatalytic growth of Cu where the first fluid may comprise a solution with de-ionized (Dl) water as the main component of the solution, with copper sulfate (CuSO4) and hydrofluoric acid (HF) to provide the copper and fluorine ions, and 0.001–2 mol/liter of $Cu^{+2}$ ions, 0.001–5 mol/liter of F ions and 0.01–10 gm/liter of surfactant material comprising RHODAFAC RE 610 (manufactured by Rhone-Poulenc), polyethylene glycol and Triton X-1OO (both manufactured by Aldrich). Holding tank 68 would for example contain the second or next fluid that would be a mixture of $CuSO_4$, EDTA (ethylenediaminetetraacetic acid), TMAH, HCHO (formaldehyde) or OHCCOOH (glyoxylic acid) to provide the electroless deposition copper. The sequential order of steps for this process would include the following: load wafers 38, remove the air from the sealed process chamber 30 and fill it with $N_2$; fill inner process chamber 36 with the first fluid from holding tank 62; catalytic surface activation on wafers 38 with the first fluid; re-circulate the first fluid from inner process chamber 36 through the re-circulation system; drain inner process chamber 36 of the first fluid; rinse inner process chamber 36 with Dl water; fill inner process chamber 36 with the next fluid from holding tank 68; electroless Cu deposition on the wafers with the next fluid; re-circulate the next fluid from inner process chamber 36 through the re-circulation system; drain inner process chamber 36; rinse inner process chamber 36 with Dl water; and dry sealed process chamber 30 and wafers 38 with $N_2$. One skilled in the art will appreciate aqueous fluids will fill the inner process chamber 36 first, in route to saturating the wafers 38 with the fluid, before exiting the inner process chamber 36 through overflow weir 34 as in the above example. Gaseous fluids such as $N_2$, on the other hand, will permeate through out sealed process chamber 30 while saturating the wafers 38. Both instances allow different types of fluids to flow over the wafers during the process.

Figure 3:
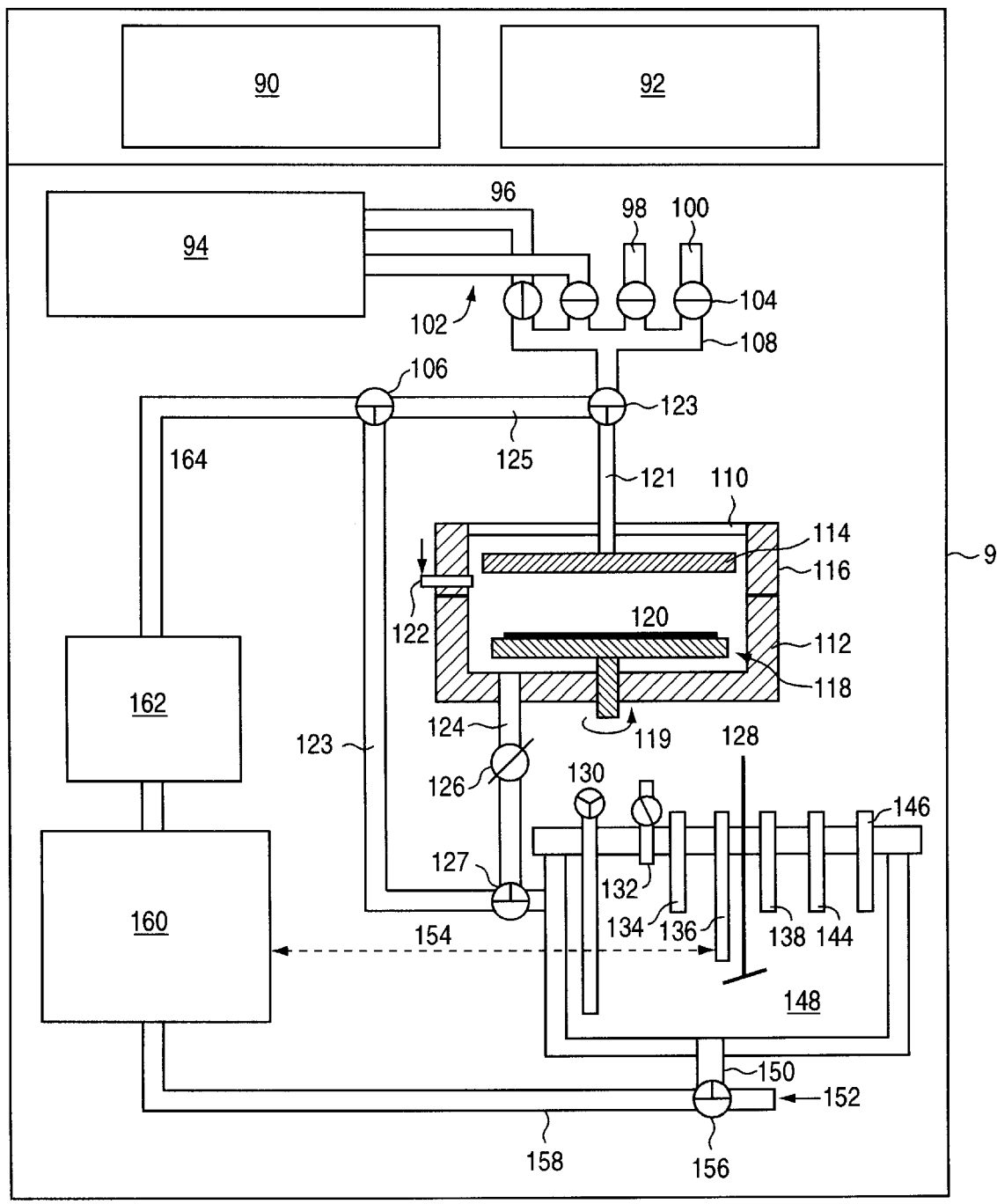
FIG. 3 is a schematic diagram of a spray immersion embodiment for processing a wafer.

FIG. 3 is a schematic diagram of another embodiment showing a spray immersion apparatus 9 used for processing a single wafer 120. Although this embodiment is shown with a single wafer, it is adaptable to process multiple wafers. This embodiment comprises a process chamber 112 with a window 110, a cover 116. A wafer housing 118 further comprises a rotating turntable (or shuck) that rotates wafer 120 in direction 119. A data acquisition and control system 92 and a monitoring and measuring system 90 control and monitor the spray immersion apparatus 9. The processing fluid enters process chamber 112 through an inlet 121. Inlet 121 connects to a spray bar 114, which disperses the fluid onto the rotating semiconductor wafer 120 in a uniform flow. The fluid then exits process chamber 112 through an outlet 124. Inlet 122 is a separate inlet that allows nitrogen to enter process chamber 112.

The re-circulation system in apparatus 9 includes a holding tank 148, a temperature control system 160, and a pump and filter system 162. Holding tank 148 may agitate the fluid with a stirring paddle 128. Other monitoring instruments available for attachment to the holding tank include a pH meter 134, a temperature meter 136 (154 indicates the communication between the temperature meter 136 and a temperature control system 160), an $O_2$ monitoring meter 138, a pressure meter 132, and the other ion meters 144 and 146. A valve 130 is the $N_2$ control to help the fluids enter and leave holding tank 148. After leaving holding tank 148, the fluid proceeds through the temperature control system 160 and a combination pump and filter system 162 before re-circulating back into process chamber 112. The flow valves 106, 123, 126, 127, and 156 control the flow of the fluid through the re-circulation and the distribution system. During a process step, the flow valves allow the fluid to circulate from process chamber 112 back through the re-circulation system. In situations where the fluid needs changing, a flow valve 156 allows the used fluid to flow out to a waste system 152. When needing other processing fluids, flow valves 127 and 156 operate as the distribution valves that allow other processing fluids supplied from other holding tanks to enter into the recirculation system in a sequential and specified order. Dl water 100 enters the distribution system through a valve 104 and flow valve 123 allows the water mixture to enter the recirculation system from the distribution system. The distribution system consists of the necessary pipes and holding facilities such as multiple pressurized canisters 94 to allow more than one chemical added into the recirculation system and the process chamber to control the concentration of the processing fluid such as Cu ion concentration and pH value.

Figure 4A:
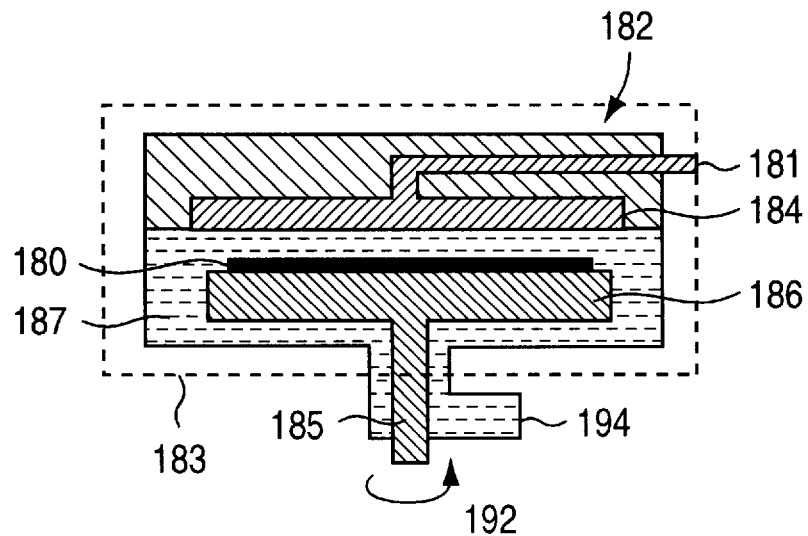
FIG. 4A shows a spray immersion process chamber.
Figure 4B:
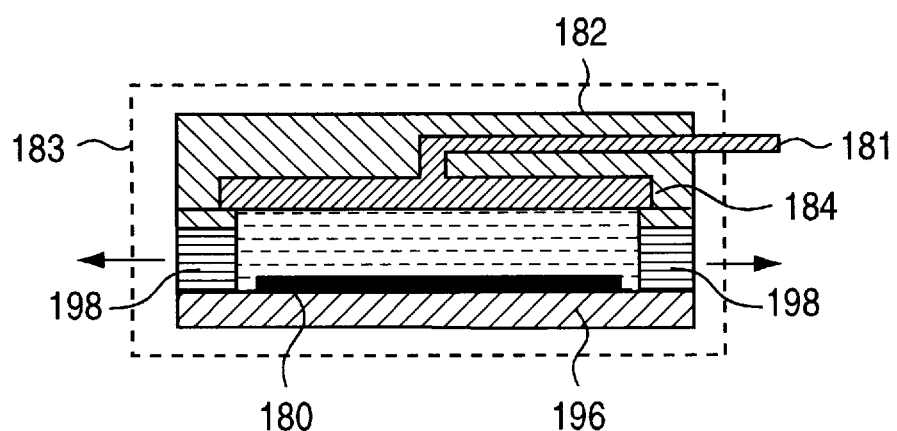
FIG. 4B shows an alternative spray immersion process chamber.

FIG. 4A shows a sealed spray immersion process chamber 183 as used in the embodiment of FIG. 3, which differs from the chamber in FIG. 3 by the location of the outlet 194. The fluid (as in FIG. 3) enters process chamber 183 through an inlet 181. A shower 184 (or spray bar) connects to inlet 181 and releases the fluid over a semiconductor wafer 180. Wafer 180 rotates on a wafer holder 186 (a turntable). The fluid then exits process chamber 183 through outlet 194. FIG. 4B shows an alternative embodiment of the process chamber of FIG. 4A where the fluid exits process chamber 183 through dispersion grates 198.

Figure 5:
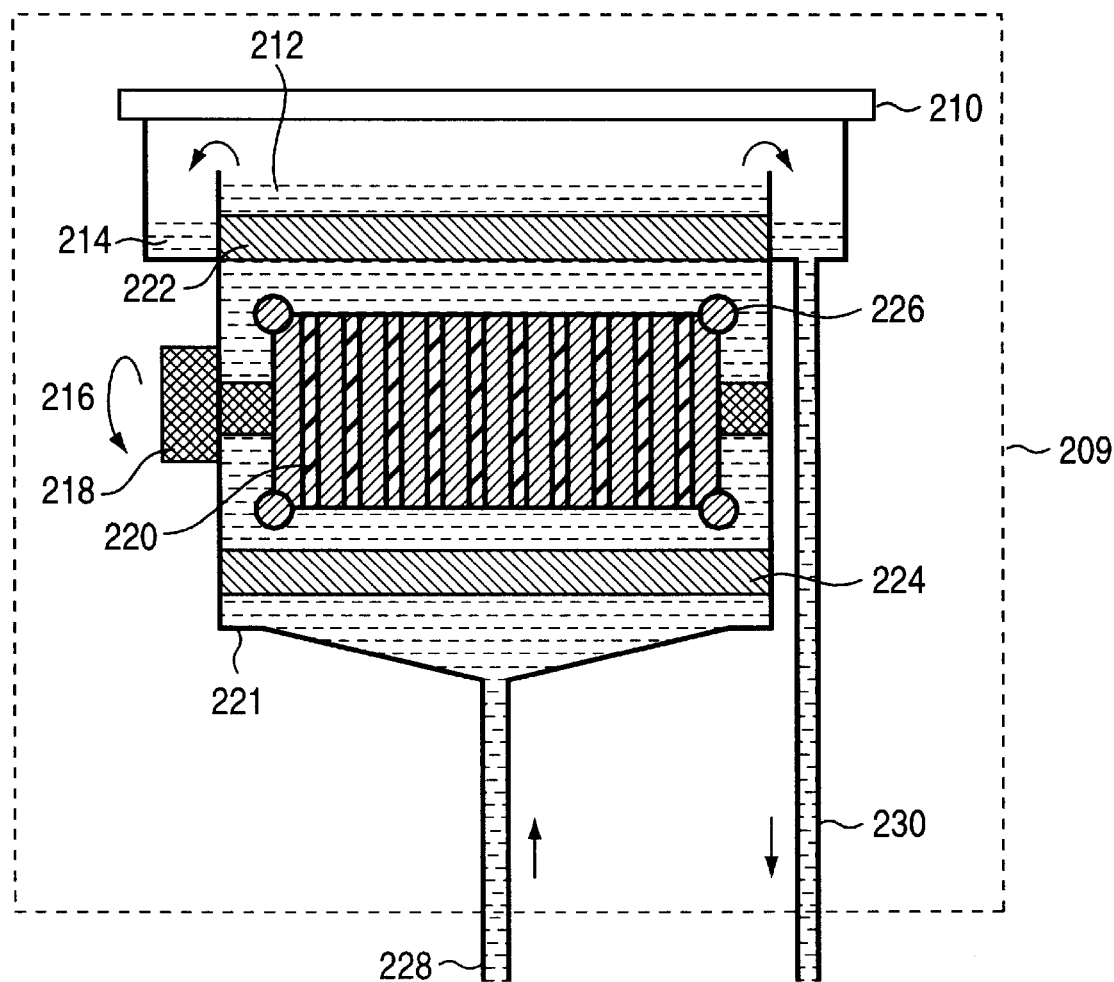
FIG. 5 shows a fully immersion process chamber.

FIG. 5 discloses a sealed process chamber 209 used in a full immersion process of the type described in FIG. 2. The process chamber 209 comprises a container 221, a cover 210, and a motor 218. A semiconductor wafer housing or holder 226 holds one or more semiconductor wafers 220 and rotatably attaches to motor 218. Motor 218 rotates holder 226 in the direction 216. Although this embodiment can process a single wafer, process chamber 209 is shown with multiple semiconductor wafers 220. A re-circulation system as described in FIG. 2 provides the fluid that flows into container 221 through an inlet 228. The dispersion grates 224 and 222 provide an even dispersion of the fluid over the wafers. The fluid 212 exits container 221 by overflowing into an overflow weir 214 and out through an outlet 230. Overflow weir 214 in this embodiment is an overflow weir that encircles container 221. The fluid then flows into a re-circulation system as previously described to re-circulate back through process chamber 209.

Figure 6A:
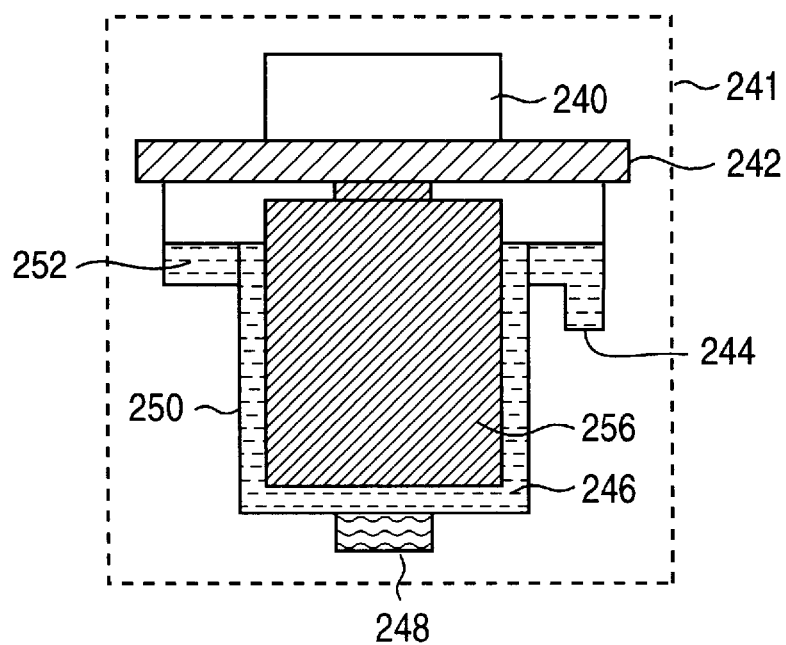
FIG. 6A and FIG. 6B are a side view and a top view of a full immersion process chamber with a rotatably mounted tubular wafer housing for multiple wafers.
Figure 6B:
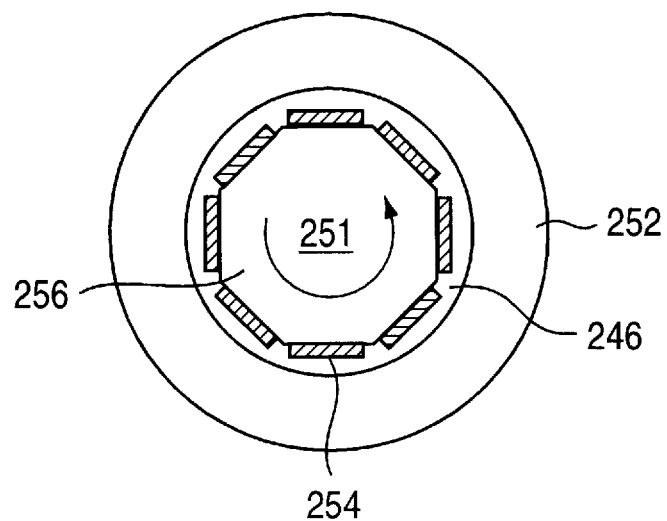

FIG. 6A and FIG. 6B show a side view and a top view respectively of a sealed process chamber 241 with a tubular wafer housing 256 for housing multiple semiconductor wafers for a full immersion system as described in FIG. 2. The process chamber 241 comprises an inner process chamber 246 surrounded by an overflow weir 252 with an outer chamber 250. Overflow weir 252 in this embodiment is an overflow weir that encircles inner process chamber 246. Semiconductor wafer housing 256 rotatably mounts within inner process chamber 246 and connects to a cover 242 and a motor 240.

Referring to FIG. 6B, semiconductor wafers 254 mount onto wafer holder 256 with rotation 251. Although this embodiment can process a single wafer, wafer housing 256 is shown with multiple semiconductor wafers 254. Wafer holder 256 is a tubular housing in an octagonal shape although tubular housings in other geometric shapes are also possible. The gap between inner process chamber 246 and wafer holder 256 is preferably between 10 mm to 50 mm to control the flow rate of the fluid and to decrease the fluid needed to fill the chamber 246.

Referring to FIG. 6A, a re-circulation system as previously described provides the fluid that flows into inner process chamber 246 through an inlet 248. The fluid exits inner process chamber 246 by overflowing into overflow weir 252 and out of the process chamber 241 through an outlet 244 and back into the re-circulation system.

Figure 7A:
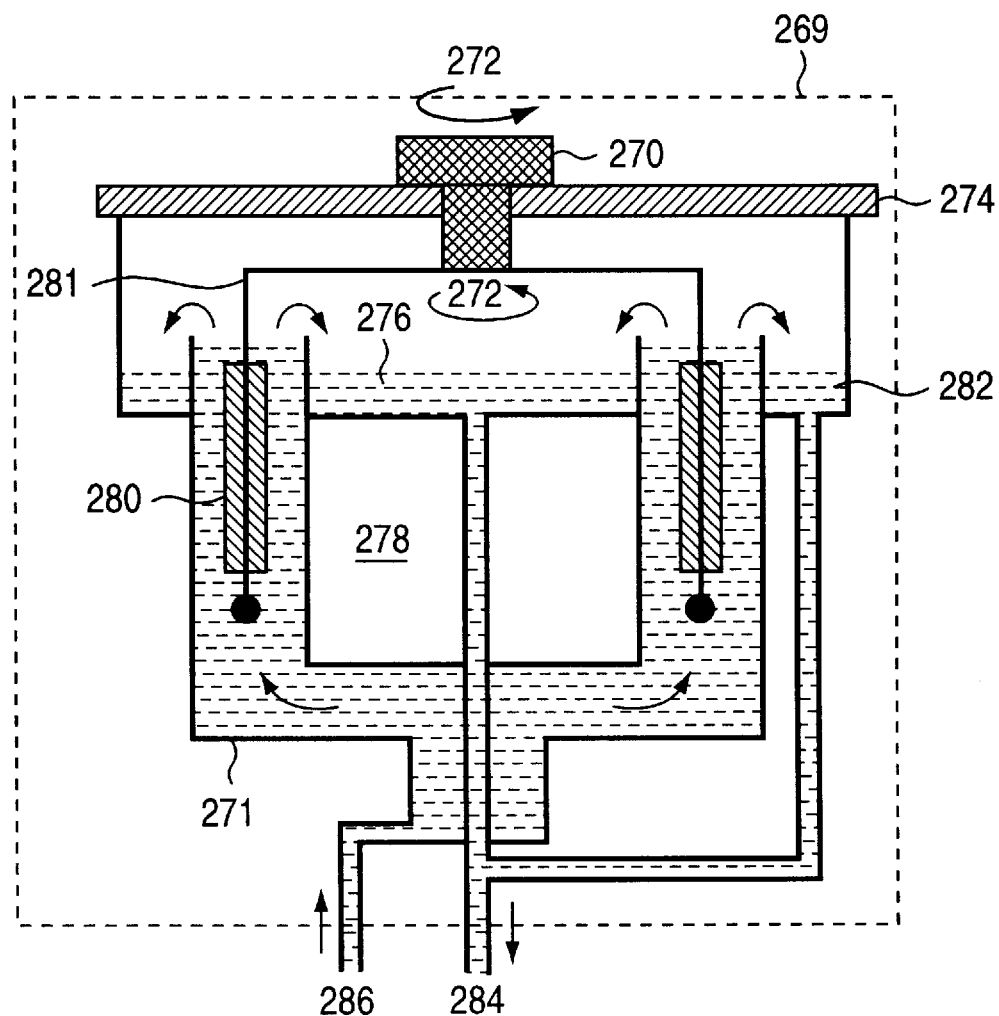
FIG. 7A is a schematic diagram of a full immersion process chamber featuring an inner core on the inside of the tubular wafer housing.

FIG. 7A is a side view of a sealed process chamber 269 that is similar to the process chamber of FIG. 6A and FIG. 6B except that process chamber 269 features an inner core 278 on the inside of the tubular wafer housing 281. The process chamber 269 comprises a container 271 and a cover 274. Attached to cover 274 is a motor 270. Rotatably attached to motor 270 is a tubular wafer housing 281 with rotation 272. A semiconductor wafer 280 can attach to the inside and or the outside surface of tubular wafer housing 281. Although this embodiment can process a single wafer, wafer housing 281 is shown with multiple semiconductor wafers 280. As disclosed in this embodiment, wafer housing 281 is a tubular housing in an octagonal shape although tubular housings in other geometric shapes are also possible. The gap between container 271 and the outside surface of tubular wafer housing 281 is preferably between 10 mm to 50 mm to control the flow rate of the fluid and to decrease the fluid needed to fill the chamber 271. Inner core 278 mounts to container 271 inside of tubular housing 281. The gap between the inner core 278 and the inside surface of housing 281 is preferably between 10 mm to 50 mm. In comparison to the embodiment of FIG. 6A and FIG. 6B, this embodiment doubles the number of wafers processed because wafer housing 281 comprises wafers mounted on the outside and inside surfaces of the housing.

Figure 7B:
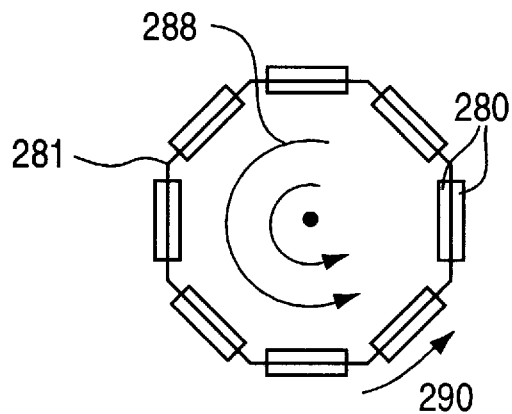
FIG. 7B shows the fluid dynamics inside the tubular wafer housing of FIG. 7A.

FIG. 7B shows the tubular wafer housing of FIG. 7A (which is similar to the housing FIG. 6B) with wafers mounted on the outside and inside surface of the tubular wafer housing 281. Without an inner core, the fluid will rotate 288 almost at the same speed of the tubular housing 281 and will produce a less consistent flow of the fluid flowing over the wafers mounted on the inside surface of tubular housing 281.

Figure 7C:
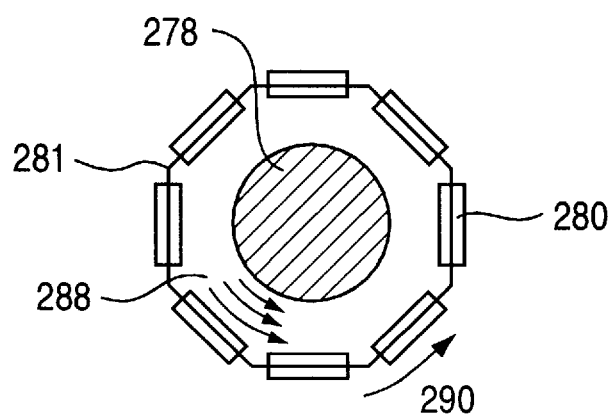
FIG. 7C shows the fluid dynamics inside the tubular wafer housing with the addition of an the inner core.

Inner core 278 as shown in FIG. 7C essentially reduces the fluid rotation 288 and also reduces the volume of the fluid used in the process. Inner core 278 not only reduces the amount of the fluid used in a given process, but also promotes better flow dynamics of the fluid over the interior mounted wafers that then promotes better uniformity in the desired chemical reaction.

Referring back to FIG. 7A, a re-circulation system as previously described provides the fluid that flows into container 271 through an inlet 286. The fluid exits container 271 by overflowing into overflow weir 282 and 276 and out through an outlet 284. The fluid then flows back into the re-circulation system.

The present invention discloses an electroless deposition apparatus and method of performing electroless deposition for processing a semiconductor wafer that uses a single sealed process chamber to subject the wafer to more than one processing fluid while retaining the wafer within the chamber. An advantage of the present invention over current practice is that the wafer is not exposed to air or other contaminants by the moving of the wafer from one bath to another. Another advantage to not exposing the wafer to air is that metals such as Cu will not oxide due to the presence of the air. Another advantage is that the present invention subjects a wafer to more than one processing fluid while retaining the wafer within a single chamber (or bath) that significantly reduces the overall process time and particle generations. And yet another advantage of the present invention is that its re-circulation system requires less chemicals overall for a given process step than conventional multiple baths.

We claim:

1. A method for processing a semiconductor wafer using electroless deposition that subjects the wafer to more than one processing fluid in a sealed process chamber while retaining the wafer in said sealed process chamber and allowing the processing of wafers to proceed in the absence of air, comprising the following steps:

introducing the first processing fluid from a distribution system into a sealed process chamber to process the wafer;

removing the first processing fluid from said sealed process chamber to said distribution system after processing the wafer;

introducing the next processing fluid from said distribution system into said sealed process chamber to process the wafer; and removing the next processing fluid from said sealed process chamber to said distribution system after processing the wafer while retaining the wafer in said sealed process chamber.

2. The method of claim 1 further comprising the step of dispersing the processing fluid in a uniform flow across the wafer.

3. The method of claim 1 wherein said sealed process chamber is a full immersion type chamber.

4. The method of claim 1 wherein said sealed process chamber is a spray immersion type chamber.

5. The method of claim 1 further comprising the step of re-circulating the first processing fluid and the next processing fluid from said sealed process chamber through a temperature system, a filtration system, and a pump system.

6. A method for processing a semiconductor wafer using electroless deposition that uses a sealed process chamber to subject the wafer to more than one processing fluid while retaining the wafer in said sealed process chamber and allowing the processing of wafers to proceed in the absence of air, comprising the following steps:

adding the first processing fluid into a sealed process chamber through an inlet;

containing the first processing fluid in said sealed process chamber while the first fluid processes the semiconductor wafer;

removing the first processing fluid from said sealed process chamber through an outlet after processing the semiconductor wafer;

adding the next processing fluid into said sealed process chamber through said inlet;

containing the next processing fluid in said sealed process chamber while the next processing fluid processes the semiconductor wafer; and removing the next processing fluid from said sealed process chamber through said outlet after processing the semiconductor wafer.

7. The method of claim 6 further comprising a tubular housing for the semiconductor wafer, said housing rotatably mounted within said sealed process chamber.

8. The method of claim 7 wherein said housing has the semiconductor wafer mounted on the inside surface of said hollow housing.

9. The method of claim 7 wherein said housing has the semiconductor wafer mounted on the outside surface of said hollow housing.

10. The method of claim 8 further comprising an inner core inside said rotatably mounted housing; said inner core mounted to said sealed process chamber.

11. The method of claim 10 wherein the gap between said inside surface of said housing and said inner core is preferably between 10 mm and 50 mm.

12. The method of claim 9 wherein the gap between said outside surface of said housing and said outer container is preferably between 10 mm and 50 mm.

13. The method of claim 6 wherein the gap between said processing of the first processing fluid further comprises the step of dispersing the first processing fluid in a uniform flow across the semiconductor wafer and wherein the processing of the next processing fluid further comprises the step of dispersing the next processing fluid in a uniform flow across the semiconductor wafer.

14. The method of claim 13 wherein said steps of dispersing further comprises a spray bar.

15. The method of claim 13 wherein said steps of dispersing further comprises a dispersion grate.

* * * * *

UNITED STATES PATENT AND TRADEMARK OFFICE
CERTIFICATE OF CORRECTION

PATENT NO. : 5,830,805
DATED : November 3, 1998
INVENTOR(S) : Yosi Shacham-Diamand et al.

It is certified that error appears in the above-identified patent and that said Letters Patent is hereby corrected as shown below:

Column 1,
Line 31, please delete "fully" and insert therefore -- full --.

Column 3,
Line 60, please delete "and or" and insert therefor -- and/or --.

Column 4,
Line 39, please insert the word -- a -- between the words "such" and "temperature".
Line 63, please delete "locomotives" and insert therefore -- locomotive --.

Column 5,
Line 1, please delete the first instance of "and" and insert therefore -- to --.
Line 45, please enter the "4" in "CuSO4" as a subscript numeral.

Column 8,
Line 39, please delete "oxide" and insert therefore -- oxidize --.

Signed and Sealed this

Eleventh Day of December, 2001

*Attest:*

NICHOLAS P. GODICI
*Attesting Officer*  *Acting Director of the United States Patent and Trademark Office*